United States Patent
Yan et al.

(10) Patent No.: US 11,710,747 B2
(45) Date of Patent: Jul. 25, 2023

(54) ARRAY SUBSTRATE, MANUFACTURING METHOD THEREOF, AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Fang Yan, Beijing (CN); Dawei Shi, Beijing (CN); Lei Yao, Beijing (CN); Zifeng Wang, Beijing (CN); Wentao Wang, Beijing (CN); Lu Yang, Beijing (CN); Haifeng Xu, Beijing (CN); Xiaowen Si, Beijing (CN); Jinfeng Wang, Beijing (CN); Lei Yan, Beijing (CN); Jinjin Xue, Beijing (CN); Lin Hou, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 951 days.

(21) Appl. No.: 16/340,606

(22) PCT Filed: Sep. 29, 2018

(86) PCT No.: PCT/CN2018/108727
§ 371 (c)(1),
(2) Date: Apr. 9, 2019

(87) PCT Pub. No.: WO2019/072120
PCT Pub. Date: Apr. 18, 2019

(65) Prior Publication Data
US 2021/0343747 A1    Nov. 4, 2021

(30) Foreign Application Priority Data

Oct. 11, 2017   (CN) .......................... 201710943163.7

(51) Int. Cl.
*H01L 27/12*       (2006.01)
*G02F 1/1362*     (2006.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
CPC .............. H01L 27/124; H01L 27/1259; G02F 1/134345; G02F 1/13439; G02F 1/136222;
(Continued)

(56) References Cited

U.S. PATENT DOCUMENTS

2002/0126243 A1 *   9/2002   Hibino .............. G02F 1/136227
                                                                                349/122
2003/0199169 A1 *  10/2003   Jun ................... H01L 21/76807
                                                                                257/E21.252
(Continued)

FOREIGN PATENT DOCUMENTS

CN    101409263 A  *  4/2009
CN    102403311 A     4/2012
(Continued)

OTHER PUBLICATIONS

The First Chinese Office Action dated Mar. 23, 2020; Appln. No. 201710943163.7.
(Continued)

*Primary Examiner* — Ermias T Woldegeorgis

(57) ABSTRACT

An array substrate, a manufacturing method thereof and a display device are provided. The array substrate includes: a
(Continued)

base substrate; a first electrode located on the base substrate and including a pad portion, the pad portion including a first surface and a second surface, the second surface being closer to the base substrate than the first surface; a first insulation layer located on the first electrode and including a first via hole; a second insulation layer located on the first insulation layer and including a second via hole; and a second electrode located on the second insulation layer; the second electrode is electrically connected with the first electrode at the pad portion through the first via hole and the second via hole, and an orthographic projection of the pad portion on the base substrate falls within an orthographic projection of the second via hole on the base substrate.

19 Claims, 6 Drawing Sheets

(51) Int. Cl.
  *G02F 1/1343* (2006.01)
  *G02F 1/1368* (2006.01)
(52) U.S. Cl.
  CPC .. *G02F 1/134345* (2021.01); *G02F 1/136222* (2021.01); *H01L 27/1259* (2013.01)
(58) Field of Classification Search
  CPC ............. G02F 1/1368; G02F 1/134372; G02F 1/136227; G02F 1/133345; G02F 1/1362; G02F 1/133357; G02F 1/136231
  See application file for complete search history.

(56) References Cited

U.S. PATENT DOCUMENTS

| | | |
|---|---|---|
| 2012/0113346 A1 | 5/2012 | Choi et al. |
| 2014/0098311 A1 | 4/2014 | Lim et al. |
| 2015/0270297 A1 | 9/2015 | Li et al. |
| 2015/0346529 A1 | 12/2015 | Park et al. |
| 2017/0141132 A1 | 5/2017 | Yin et al. |

FOREIGN PATENT DOCUMENTS

| | | | | |
|---|---|---|---|---|
| CN | 103151304 A | * | 6/2013 | |
| CN | 103913944 A | | 7/2014 | |
| CN | 105068292 A | | 11/2015 | |
| CN | 105278188 A | | 1/2016 | |
| CN | 105514125 A | | 4/2016 | |
| JP | 2003168569 A | * | 6/2003 | ......... H01L 27/3246 |
| JP | 2008-153688 A | | 7/2008 | |
| KR | 20050024199 A | * | 3/2005 | ............ B82Y 30/00 |
| KR | 20060006336 A | * | 1/2006 | |

OTHER PUBLICATIONS

International Search Report and Written Opinion dated Dec. 28, 2018; PCT/CN2018/108727.
The Extended European Search Report dated Jul. 8, 2021; Appln. No. 18859987.2.
European Patent Office Communication dated Feb. 15, 2023; Appln. No. 18 859 987.2.

* cited by examiner

ARRAY SUBSTRATE, MANUFACTURING METHOD THEREOF, AND DISPLAY DEVICE

CROSS-REFERENCE TO RELATED APPLICATION

The present application claims priority to Chinese patent application No. 201710943163.7 filed on Oct. 11, 2017, the entire disclosure of which is incorporated herein by reference as part of the present application.

TECHNICAL FIELD

At least one embodiment of the present disclosure relates to an array substrate, a manufacturing method thereof, and a display device.

BACKGROUND

With the popularization and development of various types of mobile display products, there is a higher requirement for display resolution. In particular, the virtual reality (VR) product is gradually favored by consumers with the continually development on VR product. Moreover, the pixels per inch (PPI) are higher and higher due to a small size and a high resolution.

SUMMARY

At least one embodiment of the present disclosure relates to an array substrate, a manufacturing method thereof, and a display device, which can avoid a defect of forming a dark spot.

At least one embodiment of the present disclosure provides an array substrate, which includes: a base substrate; a first electrode located on the base substrate and including a pad portion, the pad portion including a first surface and a second surface intersected with the first surface, the second surface being closer to the base substrate than the first surface; a first insulation layer located on the first electrode and including a first via hole; a second insulation layer located on the first insulation layer and including a second via hole; and a second electrode located on the second insulation layer; the second electrode is electrically connected with the first electrode at the pad portion through the first via hole and the second via hole, and an orthographic projection of the first via hole on the base substrate falls within an orthographic projection of the first surface on the base substrate.

In some embodiments, an orthographic projection of the pad portion on the base substrate falls within an orthographic projection of the second via hole on the base substrate.

In some embodiments, at least the second surface of the first electrode is in contact with the first insulation layer.

In some embodiments, a part of the first surface is in contact with the first insulation layer, and an orthographic projection of the part of the first surface on the base substrate is located outside an orthographic projection of the first via hole on the base substrate.

In some embodiments, the first electrode is a drain electrode of a thin film transistor, the second electrode is a pixel electrode, the first insulation layer is a buffer passivation layer, and the second insulation layer is a planarization layer.

In some embodiments, the first electrode includes a first sub-electrode, a second sub-electrode and a third sub-electrode located on the base substrate in sequence.

In some embodiments, a material of the second sub-electrode is more easily corroded by a developer than a material of the first sub-electrode and a material of the third sub-electrode.

In some embodiments, a material of the first sub-electrode and the third sub-electrode includes at least one selected from the group consisting of molybdenum (Mo) and titanium (Ti), and a material of the second sub-electrode includes aluminum (Al).

At least one embodiment of the present disclosure further provides a display device, which includes the array substrate provided by any one of the embodiments of the present disclosure.

At least one embodiment of the present disclosure further provides a manufacturing method of an array substrate, which includes: forming a first electrode on a base substrate, the first electrode including a pad portion, the pad portion including a first surface and a second surface intersected with the first surface, the second surface being closer to the base substrate than the first surface; forming a first insulation film on the first electrode; forming a first via hole in the first insulation film to form a first insulation layer; forming a second insulation film on the first insulation film or the first insulation layer; forming a second via hole in the second insulation film to form a second insulation layer; and forming a second electrode on the second insulation layer; the second electrode is electrically connected with the first electrode at the pad portion through the first via hole and the second via hole, and an orthographic projection of the first via hole on the base substrate falls within an orthographic projection of the first surface on the base substrate.

In some embodiments, firstly the first via hole is formed in the first insulation film, then the second insulation film is formed on the first insulation layer, and then the second via hole is formed in the second insulation film.

In some embodiments, the first via hole and the second via hole are formed by using a same mask.

In some embodiments, an area of the first via hole is less than an area of the second via hole by adjusting at least one selected from the group consisting of an exposure amount, a development time and an etch parameter.

In some embodiments, firstly the first insulation film and the second insulation film are formed, then the second via hole is formed in the second insulation film, and then the first via hole is formed in the first insulation film.

In some embodiments, the manufacturing method of the array substrate further includes: forming a photoresist film after forming the second via hole; performing a process on the photoresist film to remove a majority of the photoresist to form a photoresist layer, the photoresist layer being at an edge of the second via hole, the photoresist layer having a hollow section corresponding to the first via hole to be formed; etching the first insulation film by using the photoresist layer as a mask; and then removing the photoresist layer to form the first via hole in the first insulation film.

In some embodiments, the photoresist layer at least covers the second surface.

In some embodiments, a thickness of the photoresist film is gradually increased in a direction from a central position of the second via hole to an edge position of the second via hole.

In some embodiments, a position of the photoresist film with a minimum thickness in the second via hole is closer to the base substrate than a surface of the second insulation layer away from the base substrate.

In some embodiments, the photoresist layer is located only in the second via hole.

In some embodiments, an orthographic projection of the pad portion on the base substrate falls within an orthographic projection of the second via hole on the base substrate.

In some embodiments, the first via hole and the second via hole are formed by using a same multi-tone mask.

BRIEF DESCRIPTION OF THE DRAWINGS

Hereinafter, the drawings accompanying embodiments of the present disclosure are simply introduced in order to more clearly explain technical solution(s) of the embodiments of the present disclosure. Obviously, the described drawings below are merely related to some of the embodiments of the present disclosure without constituting any limitation thereto.

DETAILED DESCRIPTION

Figure 1A:
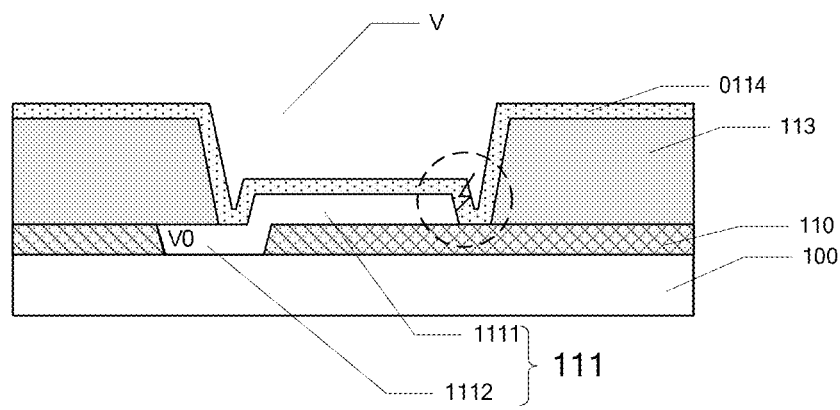
FIG. 1A is a schematic cross-sectional view of an array substrate.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the protection scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not limited to define a physical connection or mechanical connection, but may include an electrical connection, directly or indirectly. "On," "under," "right," "left" and the like are only used to indicate relative positional relationship, and when the position of the described object is changed, the relative positional relationship may be changed accordingly.

The below are described with reference to the case where a liquid crystal display device has a pixel electrode and common electrode inverse (PCI) structure, by way of example. The liquid crystal display device with the PCI structure includes a pixel electrode and a common electrode on a base substrate. The pixel electrode is closer to the base substrate than the common electrode. An electric field is formed between the common electrode and the pixel electrode, and the electric field configured to drive liquid crystal in a liquid crystal layer to rotate for display. The pixel electrode can be electrically connected to a first electrode of a thin film transistor (TFT) through a via hole penetrating an insulation layer. For example, the first electrode is a source electrode or a drain electrode of the TFT. It should be noted that the source electrode and the drain electrode are a relative concept and may be interchanged.

For example, a passivation layer (PVX) can be disposed between the pixel-electrode and the common electrode, and the passivation layer does not need to be designed with a via hole formed therein.

For example, the TFT is formed on the base substrate, a planarization layer (PLN) is disposed on the TFT, a pixel electrode, a passivation layer (PVX), and a common-electrode are disposed on the PLN in sequence. The pixel electrode can be connected to the first electrode of the TFT through the via hole penetrating the PLN, and parts of the pixel electrode, the PVX and the common electrode are formed inside the via hole in the PLN. In order to prevent a short circuit between the pixel electrode and the common electrode, requirement on the morphology of film layers inside the via hole is relatively high.

For example, as illustrated in FIG. 1A, a first electrode 111 is disposed on a base substrate 100, an interlayer dielectric layer 110 can be disposed between the first electrode 111 and the base substrate 100, and a pixel electrode 0114 is connected to a pad portion 1111 of the first electrode 111 through a via hole V penetrating a PLN 113. A connection portion 1112 of the first electrode 111 is also illustrated in FIG. 1A, and the connection portion 1112 can be a portion of the first electrode 111 other than the pad portion 1111. For example, the connection portion 1112 can be located in a via hole V0, and the via hole V0 penetrates the interlayer dielectric layer 110. For example, the pad portion 1111 and the connection portion 1112 are integrally formed, and are distinguished for convenience of description. The first electrode 111 can be connected to a semiconductor layer of a TFT through the connection portion 1112. For example, the connection portion 1112 is in contact with the semiconductor layer. A structure between the interlayer dielectric layer 110 and the base substrate 100 is omitted in FIG. 1A.

As illustrated in FIG. 1A, high PPI requires more pixels to be accommodated in the same space, so that the sub pixel pitch is reduced, which is difficult to satisfy the margin design, resulting in that a size of the via hole V in the PLN is greater than a size of the pad portion 1111.

For example, the first electrode 111 of the TFT is made of a conductive material such as a metal material. For example, the PLN is made of an insulation material such as a resin material. A developer used in a process of developing (Dev) PLN, such as tetramethylammonium hydroxide (TMAH), causes a portion of the first electrode is over-etched to be recessed, resulting in a fracture of a pixel electrode, a PVX, and a common electrode thereon upon deposition, and a short circuit between the common electrode and the pixel electrode, thereby forming a dark spot.

Figure 1B:
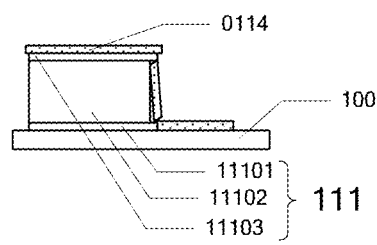
FIG. 1B is a schematic view illustrating a connecting failure of a subsequent film caused by uneven-corrosion of a first electrode at different sub-electrodes thereof.

As illustrated in FIG. 1B, the first electrode 111 includes a first sub-electrode 11101, a second sub-electrode 11102, and a third sub-electrode 11103, which are disposed on the base substrate 100 in sequence. For example, the first sub-electrode 11101 and the third sub-electrode 11103 can be configured to protect the second sub-electrode 11102. For example, a material of the second sub-electrode 11102 is more easily corroded by a developer than a material of the first sub-electrode 11101 and a material of the third sub-electrode 11103. For example, the material of the first sub-electrode 11101 and the third sub-electrode 11103 includes a material that is not easily corroded by the developer such as molybdenum (Mo) or titanium (Ti), etc. For example, the second sub-electrode 11102 includes a material that is easily corroded by the developer such as aluminum (Al). For example, the second sub-electrode 11102 is closer to the base substrate 100 than the first sub-electrode 11101. The material of each sub-electrode is not limited to the above description. The first electrode 111 may also include other numbers of sub-electrodes, without limited in the embodiment of the present disclosure. For example, the first electrode 111 includes a plurality of sub-electrodes stacked in a direction perpendicular to the base substrate 100, and at least two sub-electrodes are made of different materials. FIG. 1B illustrates that the second sub-electrode 11102 is over-etched to be recessed. The structure of the first electrode 111 is not limited to that illustrated in FIG. 1B, and the specific structure of the first electrode 111 is not limited in the embodiment of the present disclosure. For example, the material of the first electrode 111 includes metal, without limited thereto.

Figure 2:
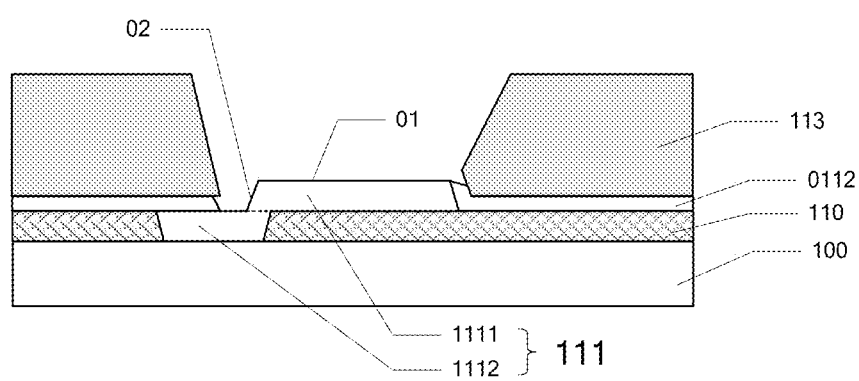
FIG. 2 is a schematic view illustrating undercut of a buffer passivation layer.
Figure 3:
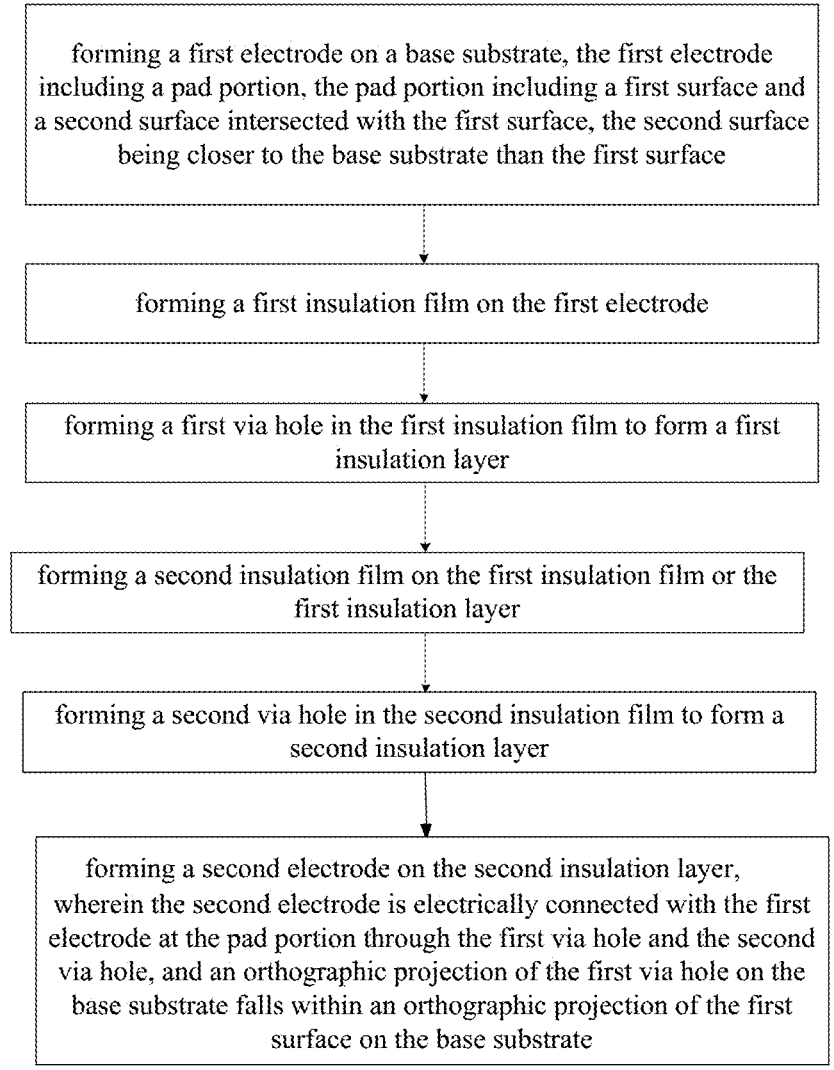
FIG. 3 is a schematic diagram illustrating a manufacturing method of an array substrate provided by an embodiment of the present disclosure.

As illustrated in FIG. 2, the pad portion 1111 includes a first surface 01 and a second surface 02 intersected with the first surface 01, and the second surface 02 is closer to the base substrate 100 than the first surface 01. Because a critical dimension (CD) of the via hole in the PLN is greater than a critical dimension (CD) of the pad portion of the first electrode 111, the second surface 02 and the first surface 01 of the pad portion 1111 are exposed by the via hole in the PLN, which causes a part of the first electrode 111 is over-etched to be recessed upon developing the PLN.

As illustrated in FIG. 2, an improvement way is to arrange a buffer passivation layer (buffer PVX) 0112 between the first electrode 111 and the PLN 113, and to etch the buffer PVX 0112 after curing the PLN. Even changing the etch conditions, the buffer PVX still has problems such as undercut and different degrees of residual, so that a serious risk of fracture of an upper film layer occurs, and resulting in a defect of a dark spot.

Figure 10:
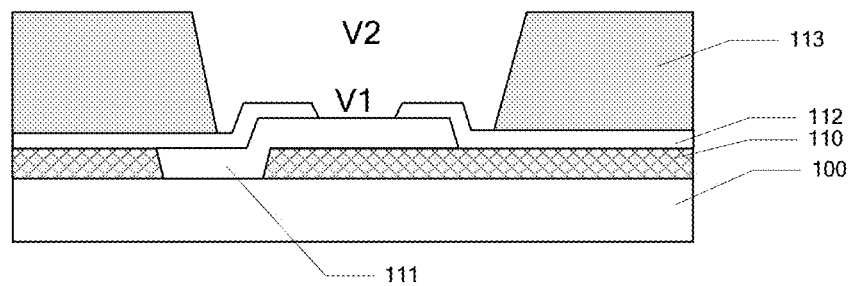
FIG. 10 is a schematic view illustrating exposing and developing a second insulation film to form a second insulation layer in a manufacturing method of an array substrate provided by an embodiment of the present disclosure.
Figure 11A:
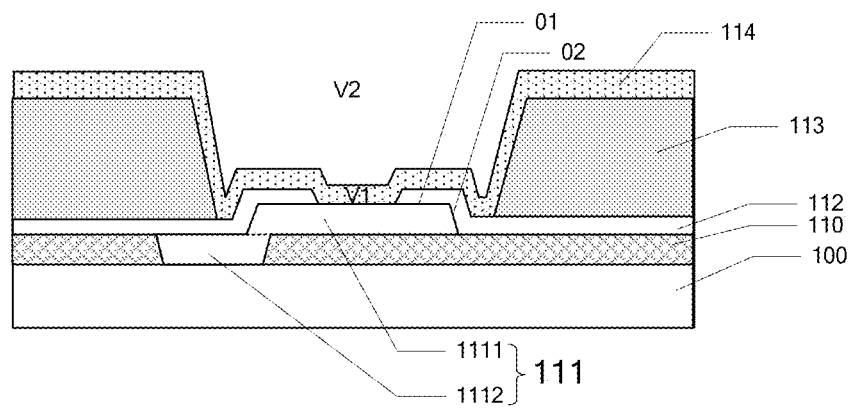
FIG. 11A is a schematic view illustrating forming a second electrode and an array substrate in a manufacturing method of an array substrate provided by an embodiment of the present disclosure.
Figure 11B:
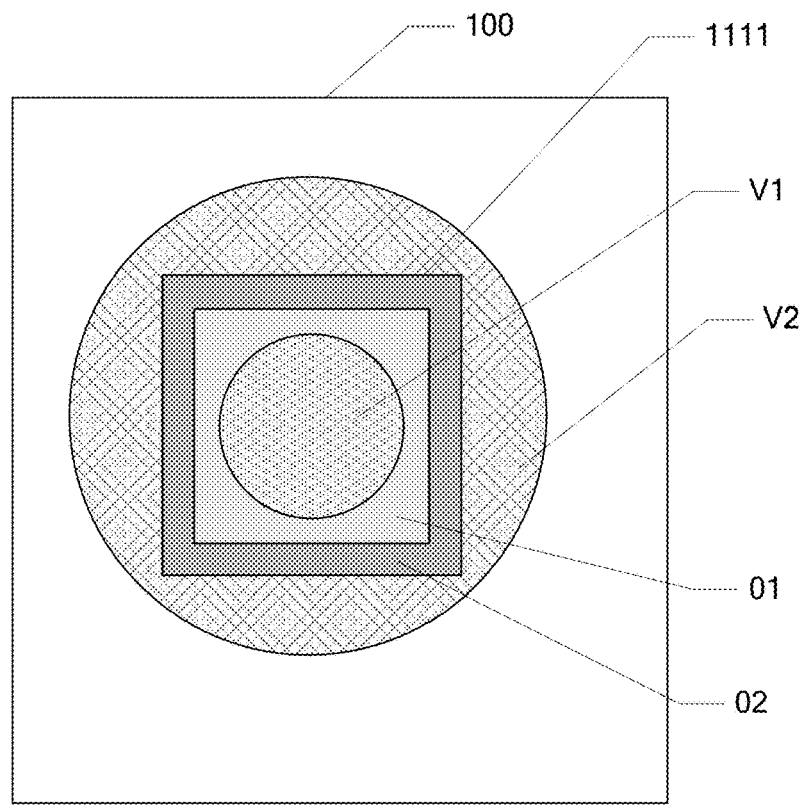
FIG. 11B is a schematic top view illustrating a pad portion (a first surface and a second surface), a first via hole and a second via hole in an array substrate provided by an embodiment of the present disclosure (other structures on the base substrate are not illustrated for convenience of viewing)

As illustrated in FIG. 3-16, at least one embodiment of the present disclosure provides a manufacturing method of an array substrate, which includes: forming a first electrode 111 on a base substrate 100, the first electrode 111 including a pad portion 1111, the pad portion 1111 including a first surface 01 and a second surface 02 intersected with the first surface 01, the second surface 02 being closer to the base substrate 100 than the first surface 01; forming a first insulation film 1120 on the first electrode 111; forming a first via hole V1 in the first insulation film 1120 to form a first insulation layer 112; forming a second insulation film 1130 on the first insulation film 1120 or the first insulation layer 112; forming a second via hole V2 in the second insulation film 1130 to form a second insulation layer 113; and forming a second electrode 114 on the second insulation layer 113; the second electrode 114 is electrically connected with the first electrode 111 at the pad portion 1111 through the first via hole V1 and the second via hole V2, and an orthographic projection of the first via hole V1 on the base substrate 100 falls within an orthographic projection of the first surface 01 on the base substrate 100 (referring to FIG. 11B). For example, in a direction perpendicular to the base substrate 100, the first via hole V1 is overlapped with the first surface 01, and an area of the first via hole V1 is less than an area of the first surface 01. For example, an area of the orthographic projection of the first via hole V1 on the base substrate 100 is less than an area of the orthographic projection of the first surface 01 on the base substrate 100.

In the embodiment of the present disclosure, "overlapped" is, for example, intended to indicate including an overlapped portion. Overlapped components/elements are not required to be completely overlapped with each other, for example, at least one of the overlapped components/elements may include a portion other than the overlapped portion.

In a manufacturing method of an array substrate provided by at least one embodiment of the present disclosure, the orthographic projection of the first via hole V1 on the base substrate 100 falls within the orthographic projection of the first surface 01 on the base substrate 100, and the area of the first via hole V1 is less than the area of the first surface 01, a side surface of the first electrode can be protected by the first insulation layer from being recessed caused by a corrosion by a developer used in a process of developing the second insulation layer, so as not to affect the formation and connection of a subsequent film layer, thereby solving the problem of a fracture of a subsequent film layer caused by corrosion and recess of the first electrode by the developer and forming a dark spot due to a short circuit between the common electrode and the pixel electrode.

For example, the second electrode may be in contact with a partial region of the pad portion to electrically connect the second electrode with the first electrode. For example, the second electrode may be in contact with at least a part of the first surface to electrically connect the second electrode with the first electrode.

Figure 6:
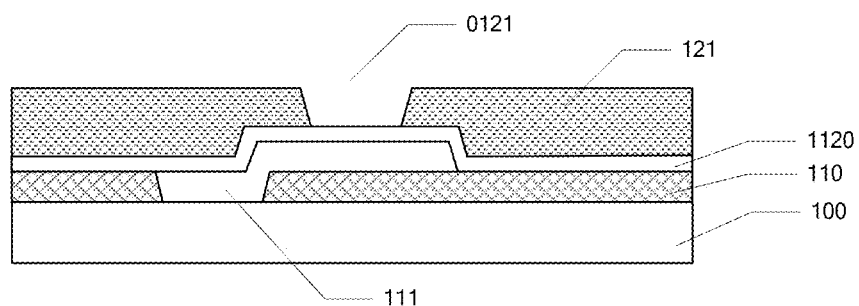
FIG. 6 is a schematic view illustrating forming a photoresist layer by developing an exposed photoresist film in a manufacturing method of an array substrate provided by an embodiment of the present disclosure.
Figure 7:
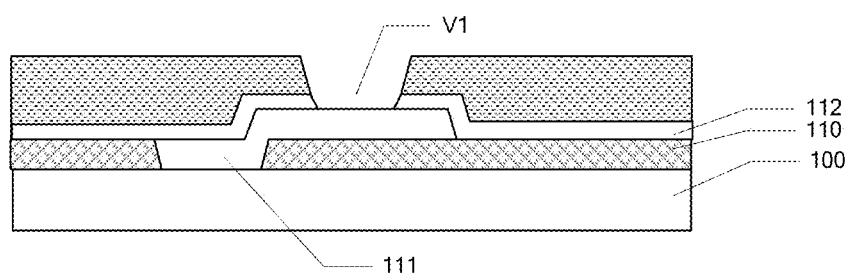
FIG. 7 is a schematic view illustrating etching a first insulation film by using a photoresist layer as a mask in a manufacturing method of an array substrate provided by an embodiment of the present disclosure.
Figure 8:
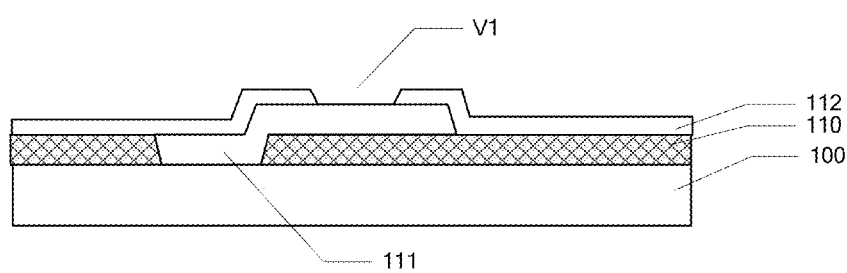
FIG. 8 is a schematic view illustrating removing a photoresist layer in a manufacturing method of an array substrate provided by an embodiment of the present disclosure.
Figure 9:
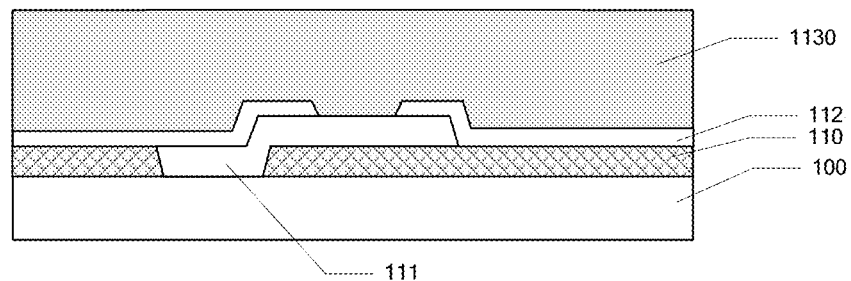
FIG. 9 is a schematic view illustrating forming a second insulation film in a manufacturing method of an array substrate provided by an embodiment of the present disclosure.

In a manufacturing method of an array substrate provided by at least one embodiment of the present disclosure, firstly the first via hole V1 is formed in the first insulation film 1120 (as illustrated in FIG. 8), then the second insulation film 1130 is formed (as illustrated in FIG. 9), and then the second via hole V2 is formed in the second insulation film 1130 (as illustrated in FIG. 10), as can be referred to FIG. 4-11. The following is further described with reference to FIG. 4-11.

Figure 4:
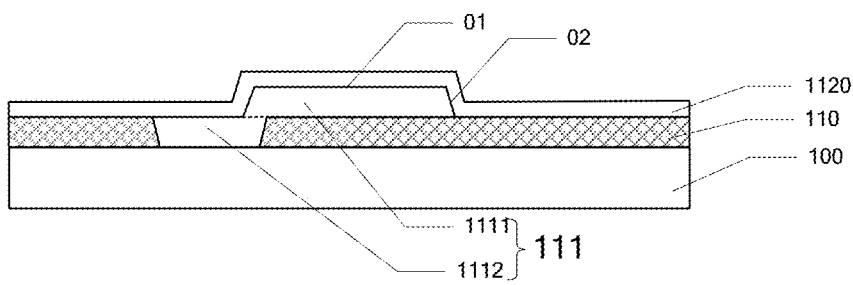
FIG. 4 is a schematic view illustrating forming a first insulation film on a base substrate in a manufacturing method of an array substrate provided by an embodiment of the present disclosure.

As illustrated in FIG. 4, forming a first insulation film 1120 on a first electrode 111. The first electrode 111 includes a pad portion 1111, the pad portion 1111 includes a first surface 01 and a second surface 02 intersected with the first surface 01, and the second surface 02 is closer to the base substrate 100 than the first surface 01. For example, the first surface 01 is a top surface of the pad portion 1111, and the second surface 02 is a side surface of the pad portion 1111. For example, the first surface 01 is a surface of the pad portion 1111 away from the base substrate 100. For example, the first surface 01 and the second surface 02 are not coplanar and are not in the same plane. For example, the second surface 02 and the first surface 01 has an angle, and a connection portion of the second surface 02 and the first surface 01 may also be a smooth connection, not limited to that illustrated in FIG. 4. For example, the first surface can be a flat surface, without limited thereto.

Figure 5:
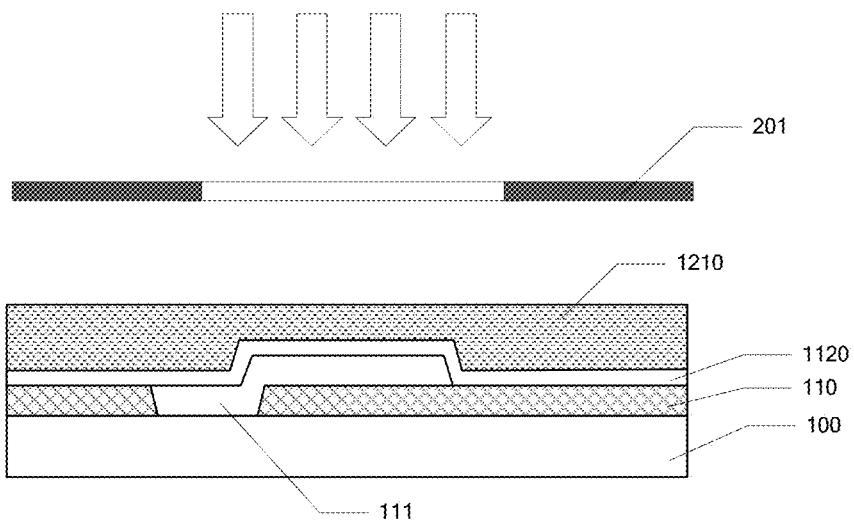
FIG. 5 is a schematic view illustrating exposing a photoresist film on a first insulation film in a manufacturing method of an array substrate provided by an embodiment of the present disclosure.

As illustrated in FIG. 5, forming a photoresist film 1210 on the first insulation film 1120, and exposing the photoresist film 1210 by using a mask 201.

As illustrated in FIG. 6, forming a photoresist layer 121 by a developing process, and forming a hollow section 0121 in the photoresist layer 121 corresponding to a first through hole V1 to be formed.

As illustrated in FIG. 7, etching the first insulation film 1120 by using the photoresist layer 121 as a mask to form a first insulation layer 112. The first insulation layer 112 has the via hole V1 penetrating the first insulation film 1120.

As illustrated in FIG. 8, removing the photoresist layer 121.

As illustrated in FIG. 9, forming a second insulation film 1130 on the first insulation layer 112.

As illustrated in FIG. 10, exposing and developing the second insulation film 1130 to form a second insulation layer 113. The second insulation layer 113 has a second via hole V2 penetrating the second insulation film. For example, the first via hole V1 can be located in the second via hole V2.

As illustrated in FIG. 11A, forming a second electrode 114. The second electrode 114 is electrically connected to the first electrode 111 at the pad portion 1111 through the first via hole V1 and the second via hole V2. For example, the second electrode 114 can also be formed by a photolithography process and an etching process. For example, firstly a second electrode film may be formed, then a photoresist pattern is formed on the second electrode film, and the second electrode film is etched by using the photoresist pattern as a mask to form the second electrode 114. For example, the second electrode 114 is a pixel electrode. The second electrode 114 may include a transparent conductive material, for example, indium tin oxide (ITO), without limited thereto. For example, in a display device with a PCI structure of a high PPI, in order to avoid a short circuit, a size of the first electrode is relatively small, and in order to form a subsequent film layer in the second via hole, the second via hole cannot be made too small, so that it is easy to form a structure in which a size of the pad portion is less than a size of the second via hole. In order to avoid the first electrode from being recessed by corrosion, the array substrate can be manufactured by using the manufacturing method of the array substrate provided by the embodiment of the present disclosure. For example, a critical dimension of the first electrode may be in a range from 2.0 μm to 2.5 μm. For example, a critical dimension of the second via hole V2 may be in a range from 3 μm to 3.5 μm. In the embodiment of the present disclosure, the sizes of the first electrode 111 and the second via hole V2 are not limited to the above description.

For example, the first via hole V1 and the second via hole V2 may be formed by using the same mask. For example, an area of the first via hole V1 is less than an area of the second via hole V2 by adjusting at least one selected from the group consisting of an exposure amount, a development time and an etch parameter. For example, compared with forming the second via hole V2, the first via hole V1 is formed by reducing at least one selected from the group consisting of the exposure amount, the development time and the etch time. For example, by reducing the exposure amount and controlling the development time, an intermediate portion is more easily removed, so that the first via hole V1 is smaller than the second via hole V2. Of course, the first via hole V1 and the second via hole V2 can be formed by using different masks.

In the embodiment of the present disclosure, the first insulation layer is added onto the first electrode, the photoresist layer of the first insulation film is exposed by using the mask forming the second insulation layer and by adjusting parameters such as the exposure amount, the first via hole V1 having a critical dimension (CD) less than that of the first surface of the pad portion is formed after developing, etching and photoresist removal, so that the second surface of the pad portion can be protected.

For example, on the basis of not introducing any new mask, forming of the first via hole V1 having a critical dimension less than the critical dimension of the second via hole V2 is achieved by performing a mask process on the first insulation film by using the same mask for forming the second insulation layer, reducing the exposure amount to expose the photoresist film of the first insulation film, and adjusting the development time. For example, the critical dimension of the first via hole V1 is less than 2.9 μm. The first via hole with a critical dimension less than that of the pad portion 1111 is ultimately obtained by continuously optimizing and adjusting the etch condition of the first insulation film. Then the photoresist removal process is performed. The subsequent process of forming the second insulation layer, the second electrode, the passivation layer, and the common electrode can be referred to usual design.

For example, as illustrated in FIG. 11A, the first electrode 111 is in contact with the first insulation layer 112. For example, the first insulation layer 112 is in contact with the second insulation layer 113. For example, the first insulation layer 112 and the second insulation layer 113 may have a single layer-structure, respectively, without limited thereto. For example, the first insulation layer 112 includes a plurality of insulation sub-layers stacked in a direction perpendicular to the base substrate 100. For example, the second insulation layer 113 includes a plurality of insulation sub-layers stacked in a direction perpendicular to the base substrate 100.

For example, as illustrated in FIG. 11A, the second electrode 114 is electrically connected to the first electrode 111 at the pad portion 1111 through the first via hole V1 and the second via hole V2, which indicates that the second electrode 114 is electrically connected to the first electrode 111 at the pad portion 1111 by having a portion located in the first via hole V1 and the second via hole V2. For example, as illustrated in FIG. 11A, the portion of the second electrode 114 is filled in the first via hole V1 and filled in a part of the second via hole V2.

For example, as illustrated in FIG. 11A, an embodiment of the present disclosure further provides an array substrate, which, for example, can be formed by any one of the above methods. The array substrate includes: a base substrate 100; a first electrode 111 located on the base substrate 100 and including a pad portion 1111, the pad portion 1111 including a first surface 01 and a second surface 02 intersected with the first surface 01, the second surface 02 being closer to the base substrate 100 than the first surface 01; a first insulation layer 112 located on the first electrode 111 and including a first via hole V1; a second insulation layer 113 located on the first insulation layer 112 and including a second via hole V2; and a second electrode located on the second insulation layer 113; the second electrode is electrically connected with the first electrode 111 at the pad portion 1111 through the first via hole V1 and the second via hole V2, and an orthographic projection of the first via hole V1 on the base substrate 100 falls within an orthographic projection of the first surface 01 on the base substrate 100 (referring to FIG. 11B). For example, in a direction perpendicular to the base substrate 100, the first via hole V1 is overlapped with the first surface 01, and an area of the first via hole V1 is less than an area of the first surface 01.

As illustrated in FIG. 11A, in an array substrate provided by an embodiment of the present disclosure, in a direction perpendicular to the base substrate 100, the pad portion 1111 is overlapped with the second via hole V2, and an area of the pad portion 1111 is less than an area of the second via hole V2. For example, an orthographic projection of the pad portion 1111 on the base substrate 100 falls within an orthographic projection of the second via hole V2 on the base substrate 100 (referring to FIG. 11B).

For example, as illustrated in FIG. 11A, in order to facilitate protection of the pad portion by the first insulation layer 112, at least the second surface 02 of the first electrode 111 (the pad portion 1111) is in contact with the first insulation layer 112.

For example, an orthographic projection of at least the second surface 02 of the first electrode 111 on the base substrate 100 falls within an orthographic projection of the first insulation layer 112 on the base substrate 100, so as to facilitate the first insulation layer to protect the second surface 02 of the pad portion 1111. For example, as illustrated in FIG. 11A, in the direction perpendicular to the base substrate 100, at least the second surface 02 of the first electrode 111 is overlapped with the first insulation layer 112 on the base substrate 100.

For example, as illustrated in FIG. 11A, a part of the first surface 01 that is not overlapped with the first via hole V1 in the direction perpendicular to the base substrate 100 is in contact with the first insulation layer 112. For example, as illustrated in FIG. 11A and FIG. 11B, a part of the first surface 01 is in contact with the first insulation layer 112, and an orthographic projection of the part of the first surface 01 on the base substrate 100 is located outside the first via hole V1.

For example, as illustrated in FIG. 11A, in the direction perpendicular to the base substrate 100, the pad portion 1111 is overlapped with the second via hole V2, and an area of the pad portion 1111 is less than an area of the second via hole V2. For example, as illustrated in FIG. 11B, an area of the orthographic projection of the pad portion 1111 on the base substrate 100 is less than an area of the orthographic projection of the second via hole V2 on the base substrate 100.

For example, as illustrated in FIG. 11A, in the direction perpendicular to the base substrate 100, the first via hole V1 is overlapped with the second via hole V2, and an area of the first via hole V1 is less than an area of the second via hole V2.

For example, as illustrated in FIG. 11A, an angle between the second surface 02 and the first surface 01 is greater than 90° and less than 180°, is an obtuse angle. Further, for example, the angle between the second surface 02 and the first surface 01 is greater than 90° and less than or equal to 135°.

FIG. 11B is a schematic top view illustrating a first surface and a second surface of a pad portion 1111, a first via hole V1 and a second via hole V2 in an array substrate provided by an embodiment of the present disclosure. For convenience of viewing, other structures on the base substrate are not illustrated. As illustrated in FIG. 11B, an orthographic projection of the first via hole V1 on the base substrate 100 falls within an orthographic projection of the first surface 01 on the base substrate 100. For example, an area of the orthographic projection of the first via hole V1 on the base substrate 100 is less than an area of the orthographic projection of the first surface 01 on the base substrate 100. For example, as illustrated in FIG. 11B, an orthographic projection of the pad portion 1111 on the base substrate 100 falls within an orthographic projection of the second via hole V2 on the base substrate 100. For example, an area of the orthographic projection of the pad portion 1111 on the base substrate 100 is less than an area of the orthographic projection of the second via hole V2 on the base substrate 100.

For example, FIG. 11B illustrates an orthographic projection relationship of critical dimensions of the components on the base substrate, or an orthographic projection relationship of the minimum orthographic projections of the components on the base substrate as can be understood, or an orthographic projection relationship of the maximum orthographic projections of the components on the base substrate as can be understood. For example, the structure illustrated in FIG. 11B can also be referred to an orthographic projection relationship of the top surfaces of the components on the base substrate. For example, the structure illustrated in FIG. 11B can also be referred to an orthographic projection relationship of the bottom surfaces of the components on the base substrate. For example, when elements/components are compared, the same benchmark can be adopted. For example, critical dimensions can be adopted, or top surfaces can be adopted, or bottom surfaces can be adopted, without limited thereto.

For example, as illustrated in FIG. 11B, the orthographic projection of the pad portion 1111 on the base substrate 100 falls completely within the orthographic projection of the second via hole V2 on the base substrate 100.

Figure 11C:
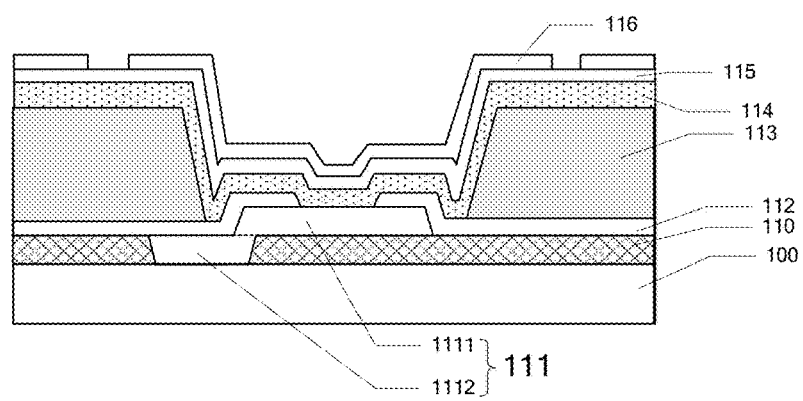
FIG. 11C is a schematic cross-sectional view illustrating an array substrate provided by an embodiment of the present disclosure.

FIG. 11C is a schematic cross-sectional view illustrating an array substrate provided by an embodiment of the present disclosure. On the structure illustrated in FIG. 11A, a passivation layer 115 can be formed, and a common electrode 116 can be formed on the passivation layer 115. A multi-dimensional electric field can be formed between the common electrode 116 and the second electrode 114 to drive liquid crystal molecules to rotate. For example, the common electrode 116 can include a slit electrode, without limited thereto. For example, the common electrode can include a transparent conductive material, for example, indium tin oxide (ITO), without limited thereto.

In order to avoid a fracture of a film layer formed after the first electrode, to avoid a short circuit and to avoid a dark spot defect, other methods can be employed. Hereinafter, a manufacturing method of an array substrate provided by another embodiment is described.

In the manufacturing method of the array substrate provided by another embodiment of the present disclosure, firstly forming the second via hole V2 in the second insulation film 1130, then forming the first via hole V1 in the first insulation film 1120 to obtain a structure in which a critical dimension of the pad portion 1111 is less than a critical dimension of the first via hole V1, that is, in the direction perpendicular to the base substrate 100, the pad portion 1111 is overlapped with the first via hole V1, and an area of the pad portion is less than an area of the first via hole V1, thereby protecting the first electrode from being recessed by corrosion, and avoiding the subsequent film layers (for example, the pixel electrode and the common electrode) from being fractured to cause a short circuit problem and further to form a dark spot defect, as can be referred to FIG. 12-16. The following is further described with reference to FIG. 12-16.

Figure 12:
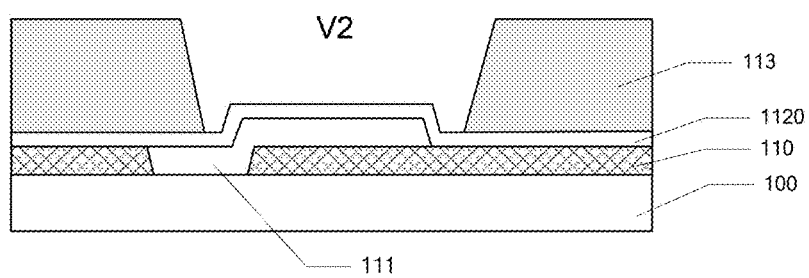
FIG. 12 is a schematic view illustrating forming a first insulation film and a second insulation film, and forming a second via hole V2 in the second insulation film in a manufacturing method of an array substrate provided by another embodiment of the present disclosure.

As illustrated in FIG. 12, firstly forming the first insulation film 1120, then forming the second insulation film 1130, and forming the second via hole V2 in the second insulation film 1130, so as to obtain a second insulation layer 113.

Figure 13:
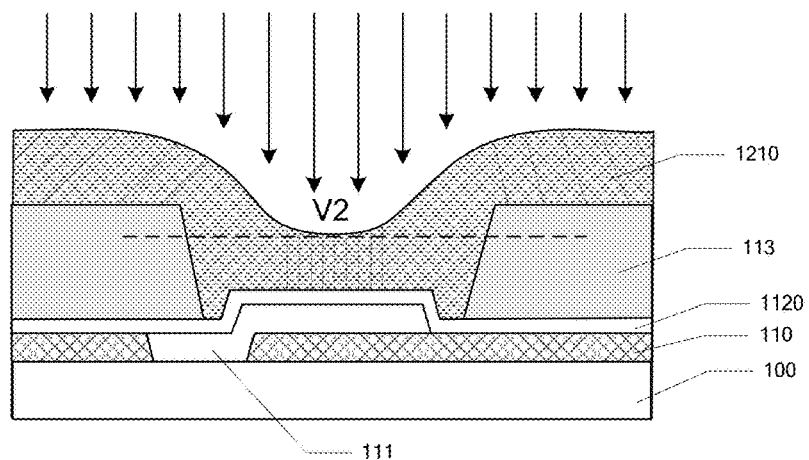
FIG. 13 is a schematic view illustrating forming a photoresist film and performing a process on the photoresist film in a manufacturing method of an array substrate provided by another embodiment of the present disclosure.

As illustrated in FIG. 13, after forming the second via hole V2 in the second insulation film 1130, forming a photoresist film 1210 on the second insulation layer 113, and processing the photoresist film 1210.

For example, because a thickness of the second insulation film 1130 is relatively great, for example, greater than or equal to 2.3 µm, a step of the inside and the outside of the second via hole V2 is large, so that after being coated, the photoresist film 1210 in the hole has a thin center and a thick edge. After being processed, a part of the photoresist film 1210 with a relatively small thickness in the second via hole V2 can be bombarded off, and there still retains photoresist on the edge of the second via hole V2.

For example, as illustrated in FIG. 13, a thickness of the photoresist film 1210 at a central position of the second via hole V2 is less than a thickness of the photoresist film 1210 at an edge position of the second via hole V2. For example, a position of the photoresist film with a minimum thickness in the second via hole V2 is closer to the base substrate 100 than a surface of the second insulation layer 113 away from the base substrate 100. For example, the maximum thickness of the photoresist film 1210 can be less than a thickness of the second insulation film 1130/the second insulation layer 113. For example, a thickness of the photoresist film 1210 is gradually increased in a direction from the center position of the second via hole V2 to the edge position of the second via hole V2. For example, the photoresist film 1210 can be formed by using a spin coating method.

For example, a descuming process is performed on the photoresist film 1210, to remove a part of the photoresist film 1210 having a small thickness in the second via hole V2, and to retain a part of the photoresist at the edge of the second via hole V2, so as to facilitate forming of the first via hole V1 with an area less than that of the pad portion, thereby protecting the second surface of the pad portion. For example, the descuming process can be performed by using a dry etching method, without limited thereto. Upon dry etching, the photoresist layer of a desired pattern can be obtained by adjusting the process parameters. For example, upon performing the descuming process, a part of the second insulation layer at a top thereof can also be removed when a part of the photoresist is removed.

Figure 14:
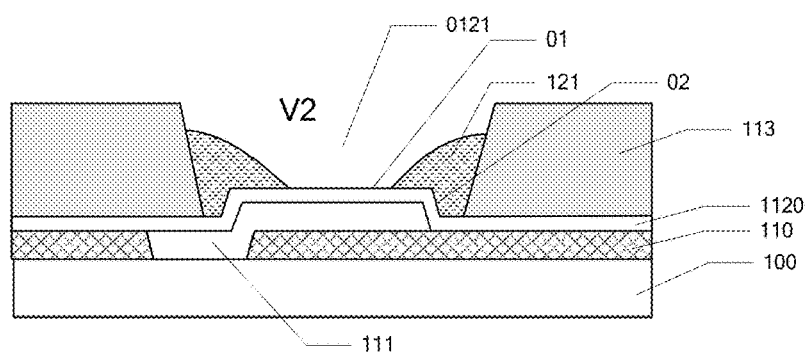
FIG. 14 is a schematic view illustrating forming a photoresist layer after performing a process on a photoresist film in a manufacturing method of an array substrate provided by another embodiment of the present disclosure.

As illustrated in FIG. 14, the photoresist film 1210 is processed to remove a majority of the photoresist to form a photoresist layer 121, the photoresist layer 121 is located at the edge of the second via hole V2, and the photoresist layer has a hollow section 0121 corresponding to the first via hole V1 to be formed. For example, the photoresist layer 121 can be located only in the second via hole V2. For example, the photoresist layer 121 is annular. For example, as illustrated in FIG. 14, at least the second surface 02 of the pad portion 1111 is covered by the photoresist layer 121 so that the second surface 02 is protected by the first insulation layer. For example, as illustrated in FIG. 14, the second surface 02 and a part of the first surface adjacent to the second surface 02 are covered by the photoresist layer 121.

Figure 15:
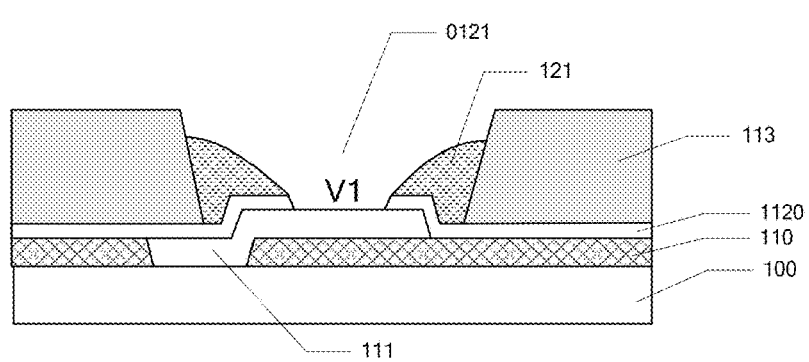
FIG. 15 is a schematic view illustrating etching a first insulation film by using a photoresist layer as a mask to form a first insulation layer (forming a first via hole V1 in the first insulation film) in a manufacturing method of an array substrate provided by another embodiment of the present disclosure.

As illustrated in FIG. 15, etching the first insulation film 1120 by using the photoresist layer 121 as a mask to form the first insulation layer 112. The first insulation layer 112 has the first via hole V1 penetrating the first insulation film 1120.

Figure 16:
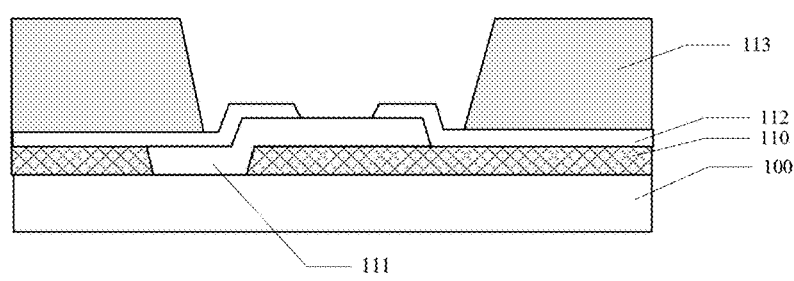
FIG. 16 is a schematic view illustrating removing a photoresist layer in a manufacturing method of an array substrate provided by another embodiment of the present disclosure.

As illustrated in FIG. 16, removing the photoresist layer 121.

The second electrode 114 is further formed to form an array substrate of the structure illustrated in FIG. 11A.

For example, the photoresist layer 121 illustrated in FIG. 14 can also be a part of the second insulation film being retained during the formation of the second via hole V2. For example, it can be realized by a multi-tone (for example, half-tone) mask process, and it is not necessary to form a photoresist film separately, and the first via hole V1 and the second via hole V2 can be formed by using the same mask. For example, after exposure with a multi-tone mask, two second insulation films of different thicknesses can be formed: a second insulation film having first thickness and a second insulation film having second thickness, and a thickness of the second insulation film having first thickness (similar to the photoresist layer 121 in FIG. 14) is less than a thickness of the second insulation film having second thickness (which can be the second insulation layer 113 in FIG. 14). After development, the second via hole V2 is formed. And after the second via hole V2 is formed, the first insulation film 1120 is etched by using the second insulation film having first thickness as a mask, thereby forming the first via hole V1, as illustrated in FIG. 15.

For example, in the manufacturing method of the array substrate provided by the embodiment of the present disclosure, the etching can be performed by using a dry etching method or a wet etching method, depending on the material to be etched.

The array substrate provided by the embodiments of the present disclosure can be manufactured by using the manufacturing methods provided by the embodiments of the present disclosure. The same or similar parts of the array substrate and the manufacturing method thereof can be referred to each other.

At least one embodiment of the present disclosure also provides a display device, which includes any one of the array substrates mentioned above, and can further include an opposite substrate opposite to the array substrate. The opposite substrate includes, for example, a color filter substrate, without limited thereto.

The display device may include a liquid crystal display device, without limited thereto, as long as the display device includes a structure of a first electrode, edges of which needs to be protected.

For example, the display device can be a displayer, such as a liquid crystal display, an electronic paper, an organic light-emitting diode (OLED) display, etc., or any product or component including the display mentioned above and having a display function, such as a television, a digital camera, a mobile phone, a watch, a tablet computer, a notebook computer, and a navigator, etc.

It should be noted that, the first electrode may not be the drain electrode of the TFT, and the second electrode may not be the pixel electrode, but other structures that needs to be electrically connected through the via hole penetrating the insulation film. For example, the first insulation layer can be a passivation layer, and the second insulation layer can be a planarization layer. For example, the passivation layer can be made of a material that is not easily corroded by a developer, which includes, for example, SiOx, SiNy, or SiOxNy. For example, the planarization layer can be an organic resin, without limited thereto.

In the embodiments of the present disclosure, the shape of the first electrode is not limited to that illustrated in the drawings, as long as it includes a pad portion, the pad portion including a first surface and a second surface intersected the first surface, and the second surface being closer to the base substrate than the first surface.

It should be noted that, for the purpose of clarity only, in accompanying drawings for illustrating the embodiment(s) of the present disclosure, the thickness and size of a layer or a structure may be enlarged. However, it should be understood that, in the case in which a component or element such as a layer, film, area, substrate or the like is referred to be "on" or "under" another component or element, it may be directly on or under the another component or element or a component or element is interposed therebetween.

In the embodiments of the present disclosure, the patterning or patterning process may include only a photolithography process, or may include a photolithography process and an etching process, or may include other processes for forming a predetermined pattern, such as printing, inkjet printing, etc. The photolithography process refers to a process including film formation, exposure, development, etc., and forms a pattern by using a photoresist, a mask, an exposure machine, etc. The corresponding patterning process can be selected in accordance with the structure formed in the embodiments of the present disclosure.

In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:

1. A manufacturing method of an array substrate, comprising:
   forming a first electrode on a base substrate, the first electrode comprising a pad portion, the pad portion comprising a first surface and a second surface intersected with the first surface, the second surface being closer to the base substrate than the first surface;
   forming a first insulation film on the first electrode;
   forming a first via hole in the first insulation film to form a first insulation layer;
   forming a second insulation film on the first insulation film or the first insulation layer;
   forming a second via hole in the second insulation film to form a second insulation layer; and
   forming a second electrode on the second insulation layer, wherein the second electrode is electrically connected with the first electrode at the pad portion through the first via hole and the second via hole, and an orthographic projection of the first via hole on the base substrate falls within an orthographic projection of the first surface on the base substrate,
   wherein firstly the first via hole is formed in the first insulation film, then the second insulation film is formed on the first insulation layer, and then the second via hole is formed in the second insulation film,
   wherein the first via hole and the second via hole are formed by using a same mask.

2. The manufacturing method of the array substrate according to claim 1, wherein an area of the first via hole is less than an area of the second via hole by adjusting at least one selected from the group consisting of an exposure amount, a development time and an etch parameter.

3. The manufacturing method of the array substrate according to claim 1, wherein an orthographic projection of the pad portion on the base substrate falls within an orthographic projection of the second via hole on the base substrate.

4. A manufacturing method of an array substrate, comprising:
   forming a first electrode on a base substrate, the first electrode comprising a pad portion, the pad portion comprising a first surface and a second surface intersected with the first surface, the second surface being closer to the base substrate than the first surface;
   forming a first insulation film on the first electrode;
   forming a first via hole in the first insulation film to form a first insulation layer;
   forming a second insulation film on the first insulation film or the first insulation layer;
   forming a second via hole in the second insulation film to form a second insulation layer; and
   forming a second electrode on the second insulation layer, wherein the second electrode is electrically connected with the first electrode at the pad portion through the first via hole and the second via hole, and an orthographic projection of the first via hole on the base substrate falls within an orthographic projection of the first surface on the base substrate,
   wherein firstly the first insulation film and the second insulation film are formed, then the second via hole is formed in the second insulation film, and then the first via hole is formed in the first insulation film, wherein the manufacturing method of the array substrate further comprises: forming a photoresist film after forming the second via hole; performing a process on the photoresist film to remove a majority of the photoresist to form a photoresist layer, the photoresist layer being at an edge of the second via hole, the photoresist layer having a hollow section corresponding to the first via hole to be formed, etching the first insulation film by using the photoresist layer as a mask; and then removing the photoresist layer to form the first via hole in the first insulation film, wherein a thickness of the photoresist film is gradually increased in a direction from a central position of the second via hole to an edge position of the second via hole.

5. The manufacturing method of the array substrate according to claim 4, wherein the photoresist layer at least covers the second surface.

6. The manufacturing method of the array substrate according to claim 4, wherein a position of the photoresist film with a minimum thickness in the second via hole is closer to the base substrate than a surface of the second insulation layer away from the base substrate.

7. The manufacturing method of the array substrate according to claim 4, wherein the photoresist layer is located only in the second via hole.

8. An array substrate, comprising:
a base substrate;
a first electrode located on the base substrate and comprising a pad portion, the pad portion comprising a first surface and a second surface intersected with the first surface, the second surface being closer to the base substrate than the first surface;
a first insulation layer located on the first electrode and comprising a first via hole;
a second insulation layer located on the first insulation layer and comprising a second via hole; and
a second electrode located on the second insulation layer,
wherein the second electrode is electrically connected with the first electrode at the pad portion through the first via hole and the second via hole, and an orthographic projection of the first via hole on the base substrate falls within an orthographic projection of the first surface on the base substrate, and
wherein the first via hole is located within the second via hole;
the array substrate further comprises an interlayer dielectric layer disposed between the first electrode and the base substrate, wherein the first electrode further comprises a connection portion, the connection portion and the pad portion are of an integral structure, the connection portion fills in a via hole penetrating the interlayer dielectric layer, and the pad portion is located above the interlayer dielectric layer.

9. The array substrate according to claim 8, wherein a distance between a bottom end face of the first via hole and the base substrate is greater than a distance between a bottom end face of the second via hole and the base substrate.

10. The array substrate according to claim 9, wherein a distance between a top end face of the first via hole and the base substrate is less than a distance between a top end face of the second via hole and the base substrate.

11. The array substrate according to claim 8, wherein an orthographic projection of the pad portion on the base substrate falls within an orthographic projection of the second via hole on the base substrate.

12. The array substrate according to claim 8, wherein at least the second surface of the first electrode is in contact with the first insulation layer.

13. The array substrate according to claim 8, wherein a part of the first surface is in contact with the first insulation layer, and an orthographic projection of the part of the first surface on the base substrate is located outside an orthographic projection of the first via hole on the base substrate.

14. The array substrate according to claim 8, wherein the first electrode is a drain electrode of a thin film transistor, the second electrode is a pixel electrode, the first insulation layer is a buffer passivation layer, and the second insulation layer is a planarization layer.

15. The array substrate according to claim 8, wherein a material of the second sub-electrode is more easily corroded by a developer than a material of the first sub- electrode and a material of the third sub-electrode.

16. A display device, comprising the array substrate according to claim 8.

17. The array substrate according to claim 8, wherein the first electrode comprises a first sub-electrode, a second sub-electrode, and a third sub-electrode that are located on the base substrate in sequence.

18. The array substrate according to claim 8, wherein a distance between a top end face of the first via hole and the base substrate is less than a distance between a top end face of the second via hole and the base substrate.

19. The array substrate according to claim 8, wherein both a bottom end face of the first via hole and a top end face of the first via hole are located between a top end face of the second via hole and a top end face of the second via hole.

* * * * *